United States Patent [19]
Yanagida

[11] Patent Number: 6,020,271
[45] Date of Patent: Feb. 1, 2000

[54] MANUFACTURING METHOD OF SEMICONDUCTOR DEVICE

[75] Inventor: Toshiharu Yanagida, Tokyo, Japan

[73] Assignee: Sony Corporation, Tokyo, Japan

[21] Appl. No.: 09/016,938

[22] Filed: Feb. 3, 1998

[30] Foreign Application Priority Data

Feb. 4, 1997 [JP] Japan .................................. P9-021632

[51] Int. Cl.[7] .................................................. H01L 21/306
[52] U.S. Cl. ............................................ 438/720; 438/742
[58] Field of Search ................................ 216/58, 67, 79, 216/75; 438/720, 721, 742

[56] References Cited

U.S. PATENT DOCUMENTS

| | | | |
|---|---|---|---|
| 5,259,923 | 11/1993 | Hori et al. .................................. | 216/66 |
| 5,294,294 | 3/1994 | Namose .................................. | 438/699 |
| 5,391,244 | 2/1995 | Kadomura .................................. | 438/695 |
| 5,409,562 | 4/1995 | Kumihashi et al. ....................... | 216/59 |

*Primary Examiner*—Benjamin Utech
*Assistant Examiner*—Donald L. Champagne
*Attorney, Agent, or Firm*—Hill & Simpson

[57] ABSTRACT

A refractory metal layer is formed on the entire surface of an interlayer insulating film having a connection hole, and then etched back by using an etching gas containing at least one of Kr, Xe, and Rn, each of which is an inert gas element having a large atomic weight. A contact plug is formed by using a resulting refractory metal layer. By employing this manufacturing method, a refractory metal layer formed by the blanket CVD method can be etched while the loading effect is prevented during overetching, and a contact plug having a flat burying surface can be formed without causing any abnormal eroded portion in a connection hole of an interlayer insulating film.

8 Claims, 2 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device and, more specifically, to a manufacturing method of a semiconductor device having a step of forming a contact plug by etching back a refractory metal layer that is formed on the entire interlayer insulating film having a connection hole.

2. Description of the Related Art

In recent years, with increases in the integration density of semiconductor devices and their performance as exemplified by those in VLSIs (very large scale integrated circuits) and ULSIs (ultra large scale integrated circuits), the proportion of the area occupied by wiring portions to the entire area of a device chip now tends to increase. The multilayered wiring technique is now indispensable for implementing semiconductor devices without causing marked increases in chip area. Conventionally, it is a common wiring forming method to form a metal thin film of, for instance, aluminum by sputtering. However, in circumstances that surface level differences of a substrate and the aspect ratios of connection holes are increased due to the advancement of the multilayered wiring, insufficient step coverage of sputtering may cause connection failures between an upper-layer interconnection and a substrate and between interconnections, which is one of the major problems of the above method.

In view of the above, a technique of filling in a connection hole of a large aspect ratio by growing selectively, i.e., in the connection hole, a refractory metal such as tungsten, molybdenum, or tantalum or some other metal such as aluminum or copper has been proposed recently. A typical means for such selective growth is a selective CVD (chemical vapor deposition) method in which a metal is deposited by reducing a gas of a metal fluoride, an organo-metallic compound, or the like with a lower-layer wiring material. However, although the selective CVD method has provided superior results in the research level, its introduction to mass-production is difficult because of several problems. For example, the selectivity gradually decreases during continuous processing, and the controllability in removing excessive growth portions called nailheads by etch back is low. A blanket CVD method in which a metal or an alloy is deposited on the entire substrate now attracts much attention as an alternative to the selective CVD method. In a typical process of the blanket CVD method, a layer of a refractory metal such as tungsten is formed so as to cover the entire insulating film that is formed with a connection hole and to fill in the connection hole.

Incidentally, etching back a refractory metal layer is necessary to fill in a connection hole with a refractory metal layer and use it as what is called a contact plug. In this etch back step, it is a common procedure to perform overetching of tens of percent in consideration of non-uniformity in processing rate in a wafer surface and among wafers. However, even in the same wafer, because of a variation in plasma density in an etching apparatus, a variation in the temperature profile of the wafer surface, and other factors, a rapid decrease of an etching area due to exposure of an interlayer insulating film occurs at an earlier stage in a region of a high etching rate than in other regions. The rapid decrease of an etching area in the region of a high etching rate causes a problem that etching species that are rendered relatively excessive due to absence of the refractory metal as bonding counterparts are concentrated in the connection hole and erode, to a large extent, the refractory metal layer and a barrier metal layer that are buried in the connection hole.

FIGS. 1A–1C are schematic sectional views of a wafer showing, in order of steps, a conventional process of forming a contact plug, and exemplify how a refractory metal layer 5 and a barrier metal layer 4 is eroded greatly in the blanket CVD method.

As shown in FIG. 1A, an interlayer insulating film 3 having a connection hole 6 for an impurity diffusion region 2 is formed on a substrate 1 that has been formed with the impurity diffusion layer 2 in advance. A barrier metal layer 4 having TiN/Ti layers is formed so as to cover the entire substrate 1 and not to fill in the connection hole 6. Further, a refractory metal layer 5 is formed by the blanket CVD method. Then, as shown in FIG. 1B, if the refractory metal layer 5 is etched back by using a fluorine-type gas, in a region of a high etching rate F* radicals are rendered excessive at an early stage after exposure of the surface of the barrier metal layer 4. The excess F*, radicals are concentrated adjacent to the surface of the refractory metal layer 5 that is buried in the connection hole 6, whereby a refractory metal eroded portion 7 is formed during overetching.

When the barrier metal layer 4 is further etched back under different conditions than in the case of FIG. 1B, radicals are rendered excessive at a time point when the surface of the interlayer insulating film 3 is exposed and the excess radicals are concentrated adjacent to a small cross-section of that portion of the barrier metal layer 4 which is buried in the connection hole 6. As a result, a barrier metal eroded portion 8 is formed as shown in FIG. 1C.

The phenomenon that the etching rate increases rapidly is generally called the loading effect. And the phenomenon that radicals are rendered relatively excessive as the area of an etching material layer decreases is a problem that frequently occurs in processes of forming a contact plug of a refractory metal layer by using the blanket CVD method and etching. There is a possibility that the loading effect will become more remarkable in the future in the field of semiconductor device manufacture because wafer diameters will increase with device chip sizes and single-wafer system plasma etching apparatuses that perform high-rate etching by using high-density plasma which does not cause a throughput reduction will become the mainstream. Therefore, it is now desired that an effective solution to the loading effect be established as early as possible.

SUMMARY OF THE INVENTION

An object of the present invention is to provide a semiconductor device manufacturing method that is effective against the loading effect, as well as a semiconductor device that is designed according to fine design rules and satisfies all of a high integration density, high performance, and high reliability.

To attain the above object, the invention provides a first manufacturing method of a semiconductor device, comprising the steps of forming a refractory metal layer of, for instance, tungsten on the entire surface of an interlayer insulating film having a connection hole; etching back the refractory metal layer by using an etching gas containing at least one of Kr, Xe, and Rn, each of which is an inert gas element having a large atomic weight; and forming a contact plug by using the refractory metal layer thus etched back.

Where an etching gas containing at least one of Kr, Xe, and Rn is used in etching back a refractory metal layer formed by the blanket CVD or the like, the absolute amount of ions having large mass among charged particles that are dissociated in discharge plasma is made larger than in a conventional case of using only a fluorine compound or a mixed gas of a fluorine compound and an inert gas of He, Ar, or the like. As a result, the process of etching back the refractory metal layer is dominated by an ion-assisted reaction and hence it proceeds with a higher degree of anisotropy. Further, the radical reactivity is also lowered by a fluorine radicals dilution effect of the inert gas, whereby the etch back proceeds in a mode including many ion-assisted reactions in contrast to the conventional case where most of the etching back reactions are radical ones. Therefore, the loading effect that is caused by concentration of excess radicals adjacent to the plug surface during the overetching can greatly be reduced. As a result, a good contact plug having a flat burying surface without any abnormal eroded portion can be formed, and a thickness reduction of the interlayer insulating film during the overetching can be made much smaller than in the conventional case of using only a fluorine-type gas.

The invention also provides a second manufacturing method of a semiconductor device, comprising the steps of forming a refractory metal layer of, for instance, tungsten on an entire surface of an interlayer insulating film having a connection hole; etching back the refractory metal layer by a first etching step of removing part of the refractory metal layer by using an etching gas containing a fluorine compound such as $SF_6$ so as to leave a residual portion of the refractory metal layer on the interlayer insulating film, and a second etching step of removing the residual portion and overetching an interface between the refractory metal layer and the interlayer insulating film and a vicinity of the interface by using an etching gas containing the fluorine compound and at least one of Kr, Xe, and Rn, each of which is an inert gas element having a large atomic weight; and forming a contact plug by using the refractory metal layer thus etched back.

In the above manufacturing method, a refractory metal layer formed by the blanket CVD method or the like is etched in two steps, i.e., by the bulk etching step that is executed until immediately before exposure of the interlayer insulating film and the subsequent overetching step. Whereas in the bulk etching step a fluorine compound such as $SF_6$ is singly used as an etching gas, in the overetching step an etching gas containing a fluorine compound such as $SF_6$ and at least one inert gas having a large atomic weight such as Kr, Xe, or Rn is used. According to this method, the etch back of bulk tungsten is dominated by a radical reaction of F* and hence it proceeds at a high rate. In etching the interface between the refractory metal layer and the interlayer insulating film and its vicinity, the amount of excess F* radicals decreases and the etching is dominated by an ion-assisted reaction. As a result, a good contact plug having a flat burying surface without any abnormal eroded portion can be formed. Further, the process enables increased throughput and hence becomes more practical.

The invention further provides a third manufacturing method of a semiconductor device, comprising the steps of forming a refractory metal layer of, for instance, tungsten on the entire surface of an interlayer insulating film having a connection hole; etching back the refractory metal layer by using an etching gas containing a sulfur compound such as $S_2F_2$ that generates free S in plasma under a discharge dissociation condition and at least one of Kr, Xe, and Rn, each of which is an inert gas element having a large atomic weight, while controlling a wafer temperature so that it is kept lower than the room temperature; and forming a contact plug by using the refractory metal layer thus etched back.

In the above manufacturing method, while the temperature of a substrate in which a refractory metal layer is formed on an interlayer insulating film is controlled to less than the room temperature, an etching gas containing a sulfur compound such as $S_2F_2$ that generates free S in plasma under a discharge dissociation condition and at least one of Kr, Xe, and Rn is used. According to this method, because the radical reaction is decelerated by controlling the substrate temperature to less than the room temperature and deposition of S concurs with its etching, the loading effect during the overetching can further be reduced and hence there occurs almost no erosion of a contact plug. Further, since the etching proceeds while minute asperities on the surface of the refractory metal layer are smoothed by deposition of S, there is no possibility that surface roughness appears after the etching in the interlayer insulating film as the undercoat layer of the refractory metal layer. As a result, the adhesion and the reliability of a wiring layer to be formed in a later step can greatly be improved from those in conventional cases. Incidentally, S that is deposited on minute asperities on the surface of the refractory metal layer can be removed by sublimation by increasing the wafer temperature to more than 90° C. after the etching, in which case S does not remain as residues and does not act as a particle contamination source.

In each of the first to third manufacturing methods, it is desirable that in the refractory metal layer etching back step the plasma density be set at $1\times10^{11}$ to $1\times10^{14}$ cm$^{-3}$. This enables setting of even superior process conditions.

DETAILED DESCRIPTION OF THE PREFERRED EMBODIMENTS

Figure 1A:
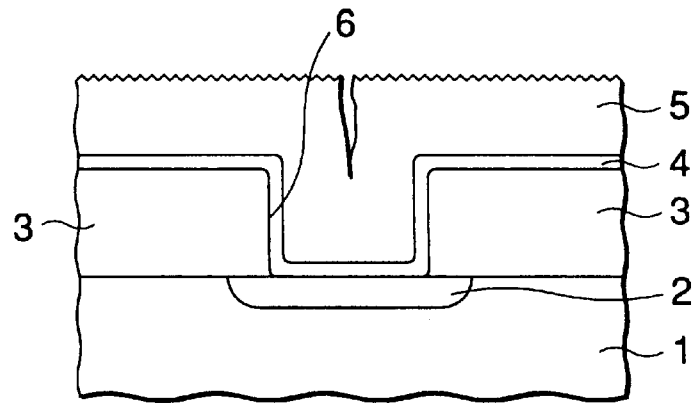
FIGS. 1A–1C are schematic sectional views of a wafer showing, in order of steps, a conventional process.
Figure 1B:
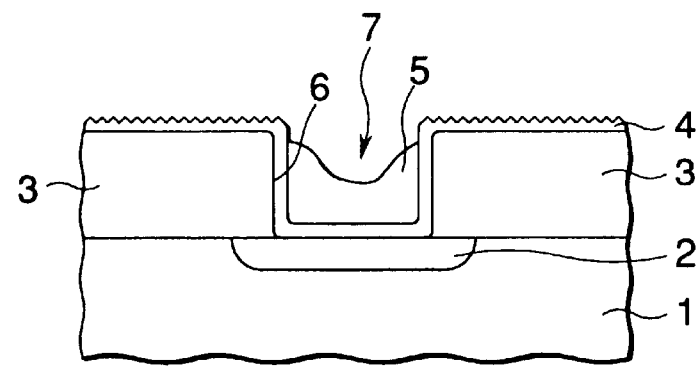
Figure 1C:
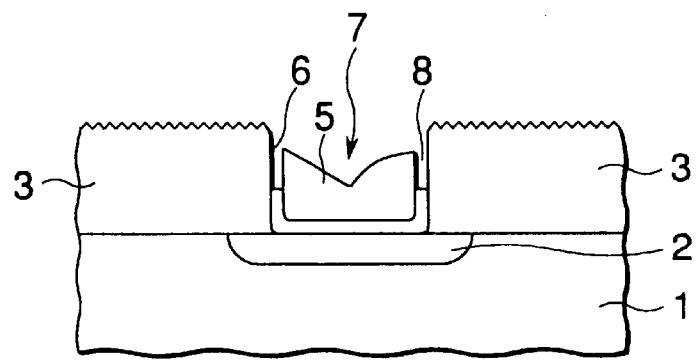

Specific, preferred embodiments of the present invention will be hereinafter described with reference to FIGS. 2A–2D that are schematic sectional views of a wafer showing, in order of steps, processes of forming a contact plug. The components in FIGS. 2A–2D that have the same structures as in the conventional case are given the same reference numerals as in the latter.

Embodiment 1

This embodiment is directed to a case where a refractory metal layer 5 that has been formed by the blanket CVD method is etched back by using a mixed gas of $SF_6$ and Kr. An exemplary process will be described below with reference to FIGS. 2A, 2C, and 2D.

Figure 2A:
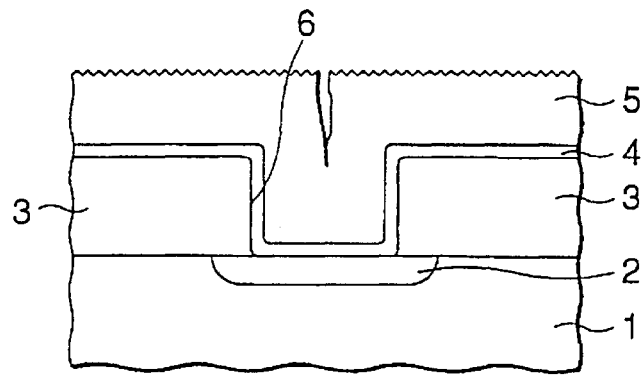
FIGS. 2A–2D are schematic sectional views of a wafer showing, in order of steps, processes according to the present invention.

As shown in FIG. 2A, a wafer is prepared in the following manner. An interlayer insulating film 3 having a connection hole 6 for an impurity diffusion region 2 is formed on a substrate 1 such as a silicon substrate that has been formed with the impurity diffusion layer 2 in advance. A barrier metal layer 4 having TiN/Ti layers is formed so as to cover the entire substrate 1 and not to fill in the connection hole 6. Further, a refractory metal layer 5 is formed by the blanket CVD method under the conditions exemplified below. That is, nuclei growth is performed for 20 seconds with settings that the $WF_6$ flow rate is 25 SCCM, the $SiH_4$ flow rate is 10 SCCM, the gas pressure is 10665.8 Pa, and the wafer temperature is 475° C. Then, the refractory metal layer 5 is deposited after switching is made to new gas supply conditions that the $WF_6$ flow rate is 60 SCCM and the $H_2$ flow rate is 360 SCCM.

Figure 2B:
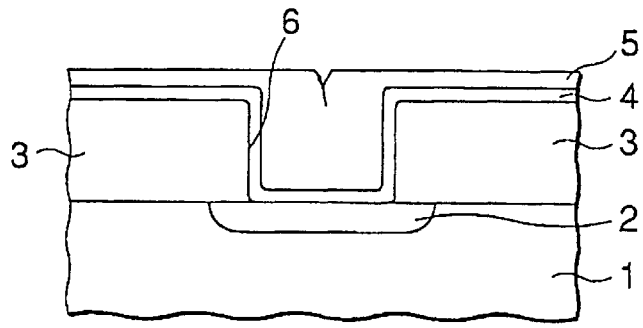
Figure 2C:
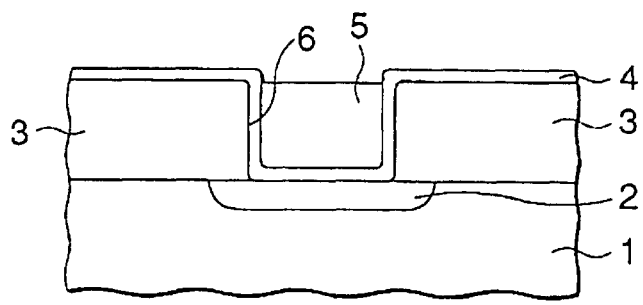

Thereafter, the wafer is set on a wafer mounting electrode of a magnetic-field-existent microwave plasma etching apparatus, and the refractory metal layer 5 is etched back under the following conditions, for instance. The etch back is stopped at a time point when the surface of the undercoat barrier metal layer 4 is exposed as shown in FIG. 2C.

Gas flow rate: $SF_6$/Kr=40/60 SCCM

Pressure: 1.3 Pa

Microwave power 850 W (2.45 GHz)

RF bias: 200 W (2 MHz)

Wafer temperature: room temperature

In the above etch back step, the etching proceeds in such a manner that a radical reaction of F* radicals that are generated in the plasma by dissociation of $SF_6$ is assisted by such ions as $Kr^+$ and $SF_x^+$. Then, the etching rate of the refractory metal layer 5 decreases because an inert gas dilutes F* radicals and an etching mode that produces $Kr^+$ ions having a large atomic weight is dominated by an ion-assisted reaction rather than a radical reaction unlike the conventional case. Therefore, even at the time point when the surface of the barrier metal layer 4 is exposed, there does not occur such an event that an etchant is excessively concentrated in the connection hole 6 and erodes the refractory metal layer 5 there. What is called the loading effect can thus be prevented. As shown in FIG. 2C, a refractory metal layer 5 that is buried in the connection hole 6 is formed so as to have a flat surface.

Figure 2D:
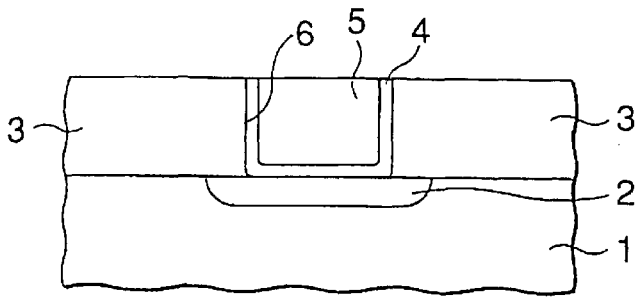

Thereafter, the barrier metal layer 4 is etched back under exemplary conditions that the $Cl_2$ flow rate is 40 SCCM, the $O_2$ flow rate is 10 SCCM, the gas pressure is 1.3 Pa, the microwave power is 850 W (2.45 GHz), and the RF bias is 200 W (2 MHz). The etch back is stopped at a time point when the interlayer insulating film 3 is exposed. As a result, as shown in FIG. 2D, the barrier metal layer 4 and the refractory metal layer 5 can be buried in the connection hole 6 so as to be flush with the interlayer insulating film 3. That is, a superior contact plug having no eroded portion can be formed.

Embodiment 2

This embodiment is directed to a case of etching back, in two steps, a refractory metal layer 5 that has been formed by the blanket CVD method. That is, the process of this embodiment includes a bulk etching step in which the refractory metal layer 5 is etched with a $SF_6$ gas and the etching is stopped before an undercoat barrier metal layer 4 is exposed, and a subsequent overetching step for removing a residual portion of the refractory metal layer 5 with a Xe-added mixed gas. An example of this process will be described below with reference to FIGS. 2A–2D. A wafer prepared is the same as the sample described in the first embodiment in connection with FIG. 2A and a redundant description therefor is omitted.

The wafer is set on a wafer mounting electrode of a magnetic-field-existent microwave plasma etching apparatus, and the refractory metal layer 5 is etched back under the following conditions, for instance. The etch back is stopped before the surface of the undercoat barrier metal layer 4 is exposed, as shown in FIG. 2B.

Gas flow rate: $SF_6$=50 SCCM

Pressure: 1.3 Pa

Microwave power 850 W (2.45 GHz)

RF bias: 200 W (2 MHz)

Wafer temperature: room temperature

In the above etching step, the etching proceeds at a high rate in such a manner that a radical reaction of F* radicals that are generated by a large amount in the plasma by dissociation of $SF_6$ is assisted by $SF_x^+$ ions. As shown in FIG. 2B, the etching is stopped in a state that a residual portion of the refractory metal layer 5 is slightly left on the barrier metal layer 4.

Subsequently, the residual portion of the refractory metal layer 5 is etched under the following conditions, for instance. The etching is stopped at a time point when the surface of the undercoat barrier metal layer 4 is exposed as shown in FIG. 2C.

Gas flow rate: $SF_6$/Xe=30/70 SCCM

Pressure: 1.3 Pa

Microwave power 850 W (2.45 GHz)

RF bias: 200 W (2 MHz)

Wafer temperature: room temperature

In this etching step, since the radicalness of the etching reaction system is further lowered because the addition of Xe causes generation of ions of a large atomic weight and dilution of F* radicals, what is called the loading effect can thus be prevented more effectively. As shown in FIG. 2C, a refractory metal layer 5 that is buried in the connection hole 6 is formed so as to have a flat surface.

Thereafter, if necessary, the barrier metal layer 4 is etched back under conditions that the $Cl_2$ flow rate is 40 SCCM, the $O_2$ flow rate is 10 SCCM, the gas pressure is 1.3 Pa, the microwave power is 850 W (2.45 GHz), and the RF bias is 200 W (2 MHz). The etch back is stopped at a time point when the interlayer insulating film 3 is exposed. As a result, as shown in FIG. 2D, the barrier metal layer 4 and the refractory metal layer 5 can be buried in the connection hole 6 so as to be flush with the interlayer insulating film 3. That is, a superior contact plug having no eroded portion can be formed.

Embodiment 3

This embodiment is directed to a case where a refractory metal layer 5 formed by the blanket CVD method is etched back while cooling a wafer by using a mixed gas of $S_2F_2$ and Kr. An example of this process will be described below again with reference to FIGS. 2A, 2C, and 2D. A wafer prepared is the same as the sample described in the first embodiment in connection with FIG. 2A and a redundant description therefor is omitted.

The wafer is set on a wafer mounting electrode of a magnetic-field-existent microwave plasma etching apparatus, and the refractory metal layer 5 is etched back under the following conditions. The etch back is stopped at a time point when the surface of the undercoat barrier metal layer 4 is exposed as shown in FIG. 2C.

Gas flow rate: $S_2F_2$/Kr=40/60 SCCM

Pressure: 1.3 Pa

Microwave power 850 W (2.45 GHz)

RF bias: 200 W (2 MHz)

Wafer temperature: 0° C.

In the above etch back step, the loading effect can be prevented very effectively because, for instance, the reactivity of radicals is reduced by low-temperature cooling of the wafer, the radicalness of the etching reaction system is lowered by generation of $Kr^+$ ions having a large atomic weight, and a concurrence of a process of depositing S that is generated by discharge dissociation of the $S_2F_2$ gas is deposited on the surface of the refractory metal layer 5 and a process of removing S therefrom by sputtering. As a result, the connection hole 6 is filled in with a flat refractory metal layer 5. In this step, the deposition of S effectively functions to smooth the surface of the refractory metal layer 5, thereby preventing surface roughness of the refractory metal layer 5 from being transferred to the undercoat interlayer insulating film 3 through the etch back.

Thereafter, if necessary, the barrier metal layer 4 is etched back under conditions that the $Cl_2$ flow rate is 40 SCCM, the $O_2$ flow rate is 10 SCCM, the gas pressure is 1.3 Pa, the microwave power is 850 W (2.45 GHz), and the RF bias is 200 W (2 MHz). The etch back is stopped at a time point when the interlayer insulating film 3 is exposed. As a result, as shown in FIG. 2D, the barrier metal layer 4 and the refractory metal layer 5 can be buried in the connection hole 6 so as to be flush with the interlayer insulating film 3. That is, a superior contact plug having no eroded portion can be formed.

This embodiment prevents the loading effect and provides an etched-back surface that is superior in smoothness. Further, this embodiment contributes to improvement in the surface homology of the interlayer insulating film after the plug formation and an upper-layer interconnection that will be formed in a later step. Therefore, this embodiment can greatly improve the adhesion to an upper-layer wiring material layer as well as the reliability from those of the conventional techniques.

The invention is not limited to the first to third embodiments described above, and selections can be made properly for the kind and the structure of the etching film, the etching apparatus, the etching conditions, etc. without departing from the spirit of the invention.

For example, although the first to third embodiments are directed to the example processes of forming a contact plug by burying the refractory metal layer 5 in the connection hole 6 for the impurity diffusion layer 2, the invention can also be applied to a process of burying a refractory metal layer in a via hole that is formed through an interlayer insulating film on a lower-layer interconnection of a multi-layered wiring substrate.

The material constituting the refractory metal layer 5 to be buried in the connection hole 6 is not limited to tungsten, and other refractory metals such as molybdenum, tantalum, and titanium may be also used. Further, other metals such as aluminum and copper may also be used.

Other than $SF_6$, fluorine compounds such as $NF_3$, $CF_4$, $ClF_3$, $XeF_2$, and $F_2$ may also be used.

Other than $S_2F_2$, sulfur compounds capable of emitting S into plasma under a discharge dissociation condition such as sulfur fluorides of $SF_2$, $SF_4$, and $S_2F_{10}$, sulfur chlorides of $S_2Cl_2$, $S_3Cl_2$, and $SCl_2$, and $H_2S$ may also be used.

Further, although the first to third embodiments use the ECR plasma etching apparatus as an exemplary etching apparatus, the invention can also be applied to cases of using other various kinds of etching apparatuses such as a parallel plate RIE (reactive ion etching) apparatus, an ICP (inductively coupled plasma) etching apparatus, a TCP (transformer coupled plasma) etching apparatus, and a helicon plasma etching apparatus.

According to the semiconductor device manufacturing method of the invention, a refractory metal layer formed by the blanket CVD method can be etched while the loading effect is prevented during overetching, and a contact plug having a flat burying surface can be formed without causing any abnormal eroded portion in a connection hole of an interlayer insulating film. As a result, the invention can provide a semiconductor device that is designed according to fine design rules and satisfies all of a high integration density, high performance, and high reliability.

What is claimed is:

1. A manufacturing method of a semiconductor device for forming a contact plug, the method comprising the steps of:

forming a refractory metal layer on an entire surface of an interlayer insulating film having a connection hole;

etching back the refractory metal layer by performing at least a two-step etching comprising:

a first etching step of removing part of the refractory metal layer by using an etching gas containing a fluorine compound so as to leave a residual portion of the refractory metal layer on the interlayer insulating film; and a second etching step of removing the residual portion and overetching an interface between the refractory metal layer and the interlayer insulating film and a vicinity of the interface by using an etching gas containing the fluorine compound and at least one inert gas element selected from the group consisting of Kr, Xe, and Rn.

2. A manufacturing method of a semiconductor device for forming a contact plug, the method comprising the steps of:

forming a refractory metal layer on an entire surface of an interlayer insulating film having a connection hole;

etching back the refractory metal layer by performing at least a two-step etching comprising:

a first etching step of removing part of the refractory metal layer by using an etching gas containing a fluorine compound so as to leave a residual portion of the refractory metal layer on the interlayer insulating film; and a second etching step of removing the residual portion and overetching an interface between the refractory metal layer and the interlayer insulating film and a vicinity of the interface by using an etching gas containing the fluorine compound at at least one inert gas element selected from the group consisting of Kr, Xe, and Rn;

while performing the plasma etching, controlling a substrate temperature so that it is kept lower than the room temperature; and forming a contact plug by using the refractory metal layer thus etched back.

3. The manufacturing method according to claim 1, wherein in the refractory metal layer etching back step a plasma density is set at $1 \times 10^{11}$ to $1 \times 10^{14}$ cm$^{-3}$.

4. The manufacturing method of claim 1 wherein the fluorine compound is selected from the group consisting of $SF_6$, $NF_3$, $CF_4$, $ClF_3$, $XeF_2$, and $F_2$.

5. The manufacturing method of claim 1 wherein the refractory metal layer includes a material selected from the group consisting of tungsten, molybdenum, tantalum, titanium, aluminum and copper.

6. The manufacturing method of claim 2 wherein the refractory metal layer includes a material selected from the group consisting of tungsten, molybdenum, tantalum, titanium, aluminum and copper.

7. The manufacturing method of claim 2 further comprising the step of heating the surface to above 90° C. to remove any sulfur deposited on the surface of the refractory metal layer.

8. The manufacturing method of claim 2, wherein in the refractory metal layer etching back step a plasma density is set at $1 \times 10^{11}$ to $1 \times 10^{14}$ cm$^{-3}$.

* * * * *